United States Patent
Vincenzoni

(10) Patent No.: US 12,155,390 B2
(45) Date of Patent: Nov. 26, 2024

(54) CLOCK RECOVERY CIRCUIT, CORRESPONDING DEVICE AND METHOD

(71) Applicant: STMicroelectronics S.r.l., Agrate Brianza (IT)

(72) Inventor: David Vincenzoni, Arcore (IT)

(73) Assignee: STMicroelectronics S.r.l., Agrate Brianza (IT)

(*) Notice: Subject to any disclaimer, the term of this patent is extended or adjusted under 35 U.S.C. 154(b) by 124 days.

(21) Appl. No.: 18/047,106

(22) Filed: Oct. 17, 2022

(65) Prior Publication Data

US 2023/0136596 A1    May 4, 2023

(30) Foreign Application Priority Data

Oct. 29, 2021    (IT) .................... 102021000027779

(51) Int. Cl.
  *H03L 7/08* (2006.01)
  *H03L 7/081* (2006.01)
  *H04L 7/00* (2006.01)
  *H04L 7/033* (2006.01)

(52) U.S. Cl.
  CPC ............ *H03L 7/0807* (2013.01); *H03L 7/081* (2013.01); *H04L 7/0079* (2013.01); *H04L 7/0331* (2013.01)

(58) Field of Classification Search
  CPC .................................................. H03L 7/0807
  USPC .......................................................... 375/355
  See application file for complete search history.

(56) References Cited

U.S. PATENT DOCUMENTS

2013/0342248 A1* 12/2013 Yang ...................... H04L 7/033
                                                              327/158
2020/0084015 A1    3/2020 Manian et al.

FOREIGN PATENT DOCUMENTS

CN           107147379 B    8/2020

* cited by examiner

*Primary Examiner* — Lihong Yu
(74) *Attorney, Agent, or Firm* — Slater Matsil, LLP

(57) ABSTRACT

A clock recovery circuit comprises an input node receiving a data signal having a data rate, and a digital oscillator producing a local clock signal with a frequency higher than the data rate. A counter clocked by the local clock signal has its count value sampled and reset at the rising and falling edges of the data signal, and a storage block coupled to the counter stores a count value that is updated in response to the current sampled count value of the counter lying in an update range between lower and upper bounds. A threshold value set is produced as a function of the updated count value stored in the storage block. Sampling circuitry receives and samples the data signal, and provides a sampled version of the data signal in response to the count value of the counter reaching any of the threshold values.

20 Claims, 6 Drawing Sheets

CLOCK RECOVERY CIRCUIT, CORRESPONDING DEVICE AND METHOD

CROSS-REFERENCE TO RELATED APPLICATIONS

This application claims the benefit of Italian Patent Application No. 102021000027779, filed on Oct. 29, 2021, which application is hereby incorporated herein by reference.

TECHNICAL FIELD

The description relates to clock recovery circuits.

One or more embodiments can be advantageously applied in a variety of arrangements where data are transmitted over a channel without transmitting a clock signal together with the data.

Automatic toll payment devices are a possible example of such applications where simplicity, low cost and reduced power absorption represent important factors.

BACKGROUND

In certain communication systems, when receiving data from a wireless/wireline connection, a clock signal proper is not received over the channel. The receiver samples the incoming data with the "same" clock of the transmitter somehow recovered from the data.

A clock recovery circuit with (very) low current absorption (low power feature) and good noise rejection is desirable for these applications.

Precise local oscillators (e.g., phase-locked-loop or PLL arrangements) adapted to be tuned (that is, to lock) on the edges of the incoming data and a local oscillator adjusted to sample correctly the incoming data may represent an option to consider for these purposes.

A disadvantage of these solutions lies in circuit complexity, which may involve a mix of analog and digital circuits. This is likely to absorb high currents, which represents a penalizing factor, e.g., for systems having limited power capabilities.

SUMMARY

An object of one or more embodiments is to contribute in addressing the issues discussed above.

According to one or more embodiments, that object is achieved via a circuit having the features set forth in the claims that follow.

One or more embodiments relate to a corresponding device. A receiver for use in automated toll payment may be exemplary of such a device.

One or more embodiments relate to a corresponding method.

The claims are an integral part of the technical teaching provided herein in respect of the embodiments.

A circuit as exemplified herein may optionally comprise a rough data detector, configured to check if incoming data are being received with a frequency falling within an expected range. If the received frequency is admissible, a local oscillator such as a Delay Locked Loop or DLL (and a possible associated clock divider) are activated to generate a clock based on the incoming data.

In a circuit as exemplified herein (possibly in response to the data rate being checked to be consistent with an expected range) a phase alignment feature is activated where a new clock is generated based on the analysis of the edges in the incoming signal; based on a check for best edges, the incoming data are analyzed and useful data are selected and used for clock reconstruction. The reconstructed clock is used for reception by the receiver device.

Examples as presented herein have very low power consumption.

In these examples, clock recovery is activated only in response to an input signal being recognized indicating received data. The clock is otherwise kept in an "off" state for the rest of the time where switching power absorption is (at least notionally) zero.

Also, examples as presented herein are based on a delay line circuit that does not involve a calibration procedure, while a phase alignment procedure facilitates detecting adequate sampling points for the incoming data (Data_in).

A simple, fully-digital clock recovery circuit is thus provided suited to be used, e.g., for wireless/wireline low data rate communication systems (hundreds of Kbit/s).

BRIEF DESCRIPTION OF THE DRAWINGS

One or more embodiments will now be described, by way of example only, with reference to the annexed figures, wherein.

The figures are drawn to clearly illustrate the relevant aspects of the embodiments and are not necessarily drawn to scale.

The edges of features drawn in the figures do not necessarily indicate the termination of the extent of the feature.

DETAILED DESCRIPTION OF ILLUSTRATIVE EMBODIMENTS

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

Also, for the sake of simplicity and ease of explanation, a same reference symbol/designation may be used throughout this description to designate both a circuit node or line and a signal occurring at that node or line.

Figure 1:
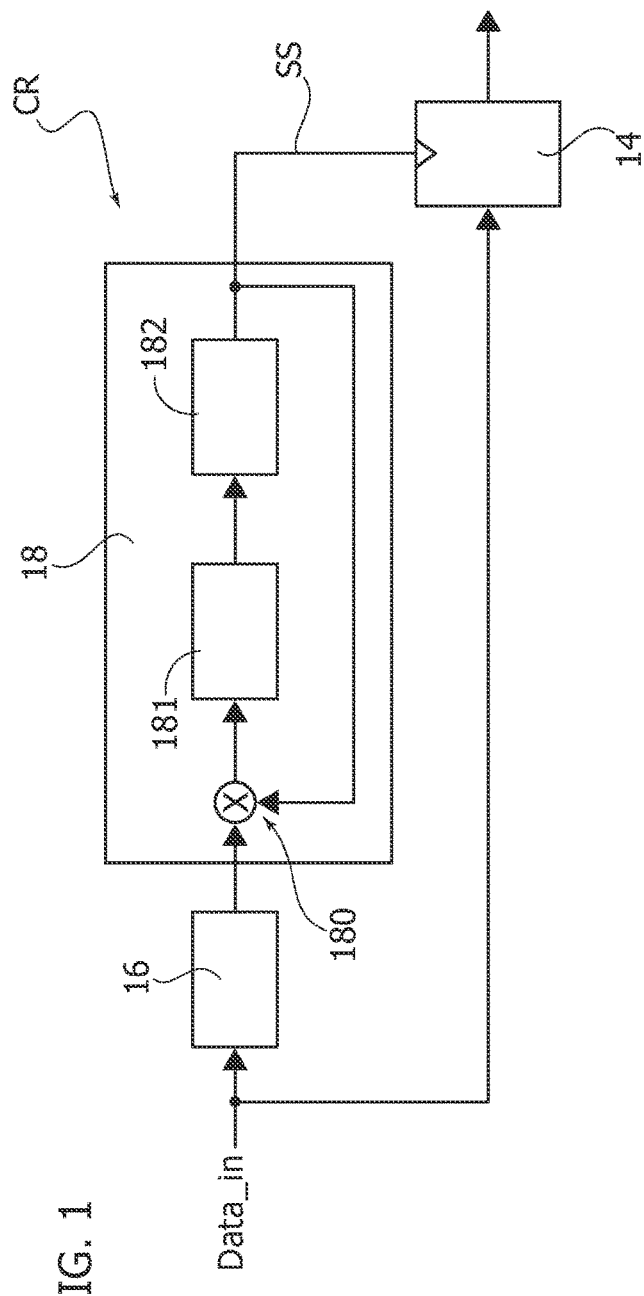
FIG. 1 is a block diagram of a conventional clock recovery circuit.

FIG. 1 is a block diagram of a conventional clock recovery circuit CR configured to receive at an input node an input data signal stream Data_in from a wireless/wireline connection (not visible in the figure) without a clock signal proper being transmitted over the channel.

The clock recovery circuit CR is expected to sample the incoming data Data_in at a sampling block 14 with the "same" clock of the incoming data recovered from the data.

To that effect the incoming data Data_in are supplied to an edge detector 16 that in turn supplies a phase-lock-loop (PLL) arrangement 18.

The PLL arrangement 18 comprises an input combination node (multiplier) 180 followed by a low-pass filter (LPF) 181 and a voltage-controlled oscillator (VCO) 182.

The output signal from the VCO 182 is, on the one hand, returned to the combination node 180 to be combined (phase-compared) with the output signal from the edge detector 16 and, on the other hand, supplied as a sampling signal to the sampling block 14.

Structure and operation of a PLL arrangement 16 as schematically presented in FIG. 1 is conventional in the art, which makes it unnecessary to provide a more detailed description herein.

A clock recovery circuit CR as illustrated in FIG. 1 relies on a precise local oscillator (e.g., PLL) that is "tuned" based on the edges of the incoming data Data_in with the local oscillator (VCO 182) adjusted in order to sample correctly the incoming data.

Despite its apparent simplicity, a clock recovery circuit CR as illustrated in FIG. 1 ends up by being rather complex, with a mix of analog and digital elements with a fairly high current absorption.

It is observed that—especially, but not exclusively—in those communication (wireline/wireless) systems that exchange data at low-rate speed (e.g., hundreds of Kbits per second) a local oscillator (e.g., a PLL arrangement) at the receiver side can be dispensed with the sampling clock reconstructed with a simple fully-digital solution.

This may be particularly the case where, even in the absence of a clock component proper, the received data signal Data_in contains transitions (edges) to an extent conveying sufficient information on the clock of the incoming data which can thus be recovered from the received data.

Figure 2:
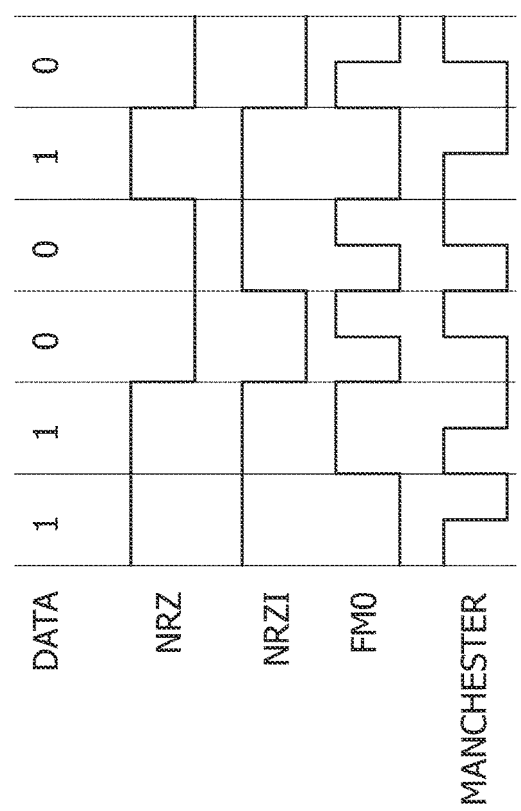
FIG. 2 comprises various diagrams exemplary of signals which may be advantageously used with clock recovery circuits according to embodiments of the present description.

FIG. 2 is an exemplary representation of various types of signals that can be advantageously used with a clock recovery circuit according to examples described herein.

Signals presented (by way of non-limiting example) in FIG. 2 comprise signals subjected to scrambling (so that they do not comprise long sequences of zeroes or ones) and/or encoded as NRZ (non-return-to-zero), NRZI (non-return-to-zero inverted), FM0 or Manchester encoded signals.

Figure 3:
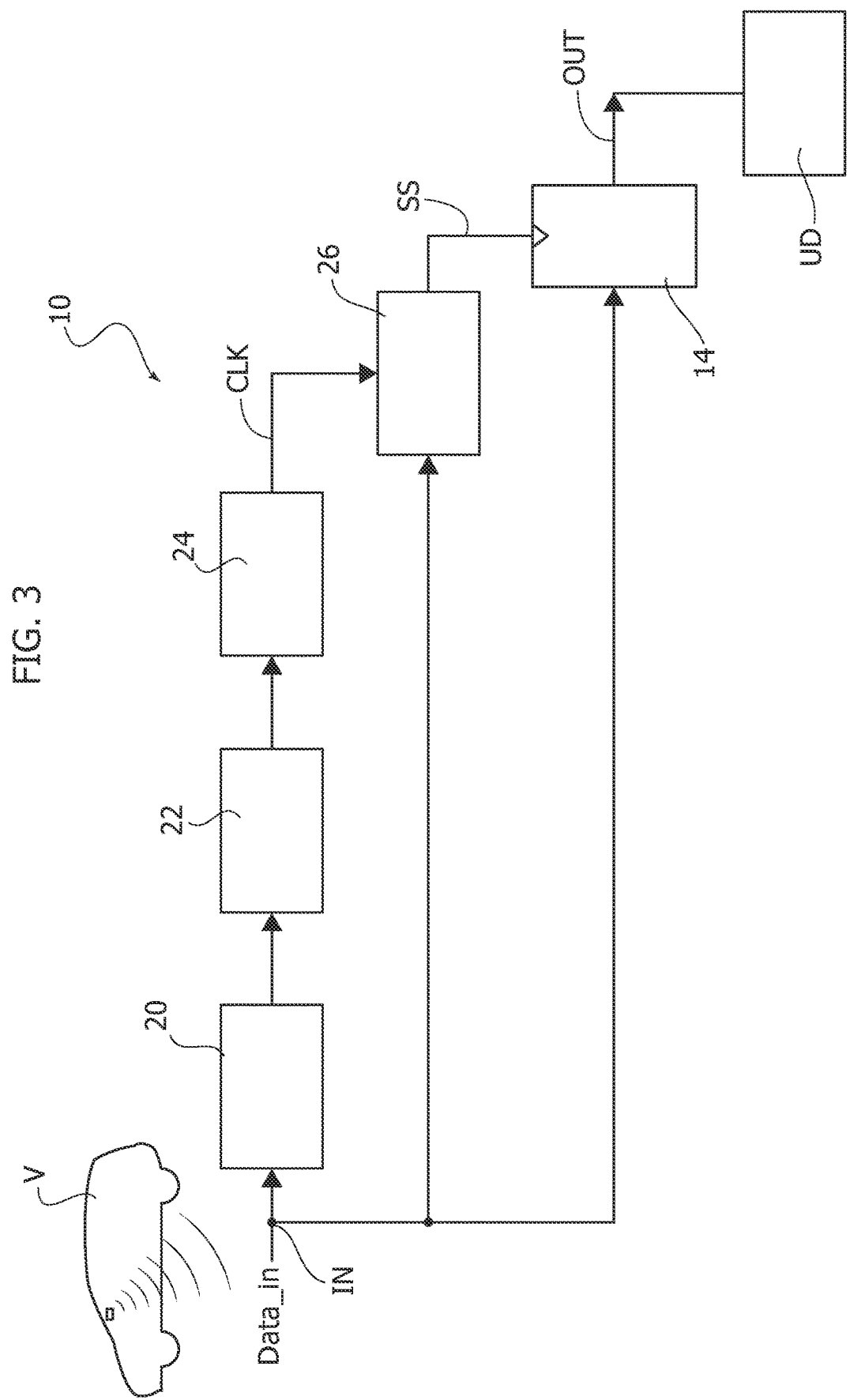
FIG. 3 is a block diagram of a clock recovery circuit according to embodiments of the present description.

As illustrated in FIG. 3, a clock recovery circuit 10 according to examples herein includes:
 a rough data detector 20 configured to receive the input data stream Data_in at an input node IN, and
 a local oscillator 22 that can be advantageously implemented as a delay-locked-loop (DLL) circuit block, possibly having a clock divider 24 cascaded thereto.

The input data stream Data_in from the node IN and the output from the local oscillator (DLL block 22/clock divider 24) are supplied to a phase alignment circuit block 26 that controls operation of the sampling block 14 via a sampling signal SS. This signal can have 1 to N components (a set of edges): two components, namely Edge1 and Edge2, will be primarily discussed by way of non-limiting example in connection with FIGS. 6 and 7.

The sampling block 14 in turn produces, at an output node OUT for use by a user device UD, a signal Sampled Data_in which results from sampling the input data stream Data_in received at the input node IN under the control of the sampling signal SS (for instance, Edge1, Edge2).

As discussed, an arrangement as exemplified herein can be advantageously applied in automated toll-payment installations configured to detect and record transit of vehicles V at a toll gate. Reference to that possible application is otherwise by way of example only and non-limiting of the embodiments.

It is otherwise noted that, while advantageous, the rough data detector 20 is an optional feature of the clock recovery circuit 10 of FIG. 3.

The rough data detector 20 may in fact facilitate checking if "useful" incoming data are received with a frequency with a range of expected data rates.

By way of example, the incoming data Data_in may be produced via a crystal oscillator having an oscillating frequency Fosc=32,768 Hz (this is of course a purely exemplary value).

The rough data detector 20 can thus be configured (in a manner known per se to those of skill in the art) to count the edges in Data_in present over a time 1/Fosc (assuming the incoming data rate is higher that 32 Kbit/s) and ascertain that the input data rate lies within an expected frequency range (between F1 and F2, for instance).

The rough data detector 20 can thus recognize a Data_in signal in this bandwidth and trigger operation of the circuit blocks cascaded thereto (only) in response to a Data_in signal received in this bandwidth.

In that way, power consumption can be reduced.

As noted, the rough data detector 20 is an optional feature (for instance, it can be avoided in case a crystal oscillator does not come into play). In case the rough data detector 20 is not present, the other circuit blocks in FIG. 3 can be assumed to be always operative.

The local oscillator 22 can be advantageously implemented as a delay-locked-loop (DLL) circuit configured to generate a (new) local clock. The frequency of the generated clock is a function of the delay implemented.

Figure 4:
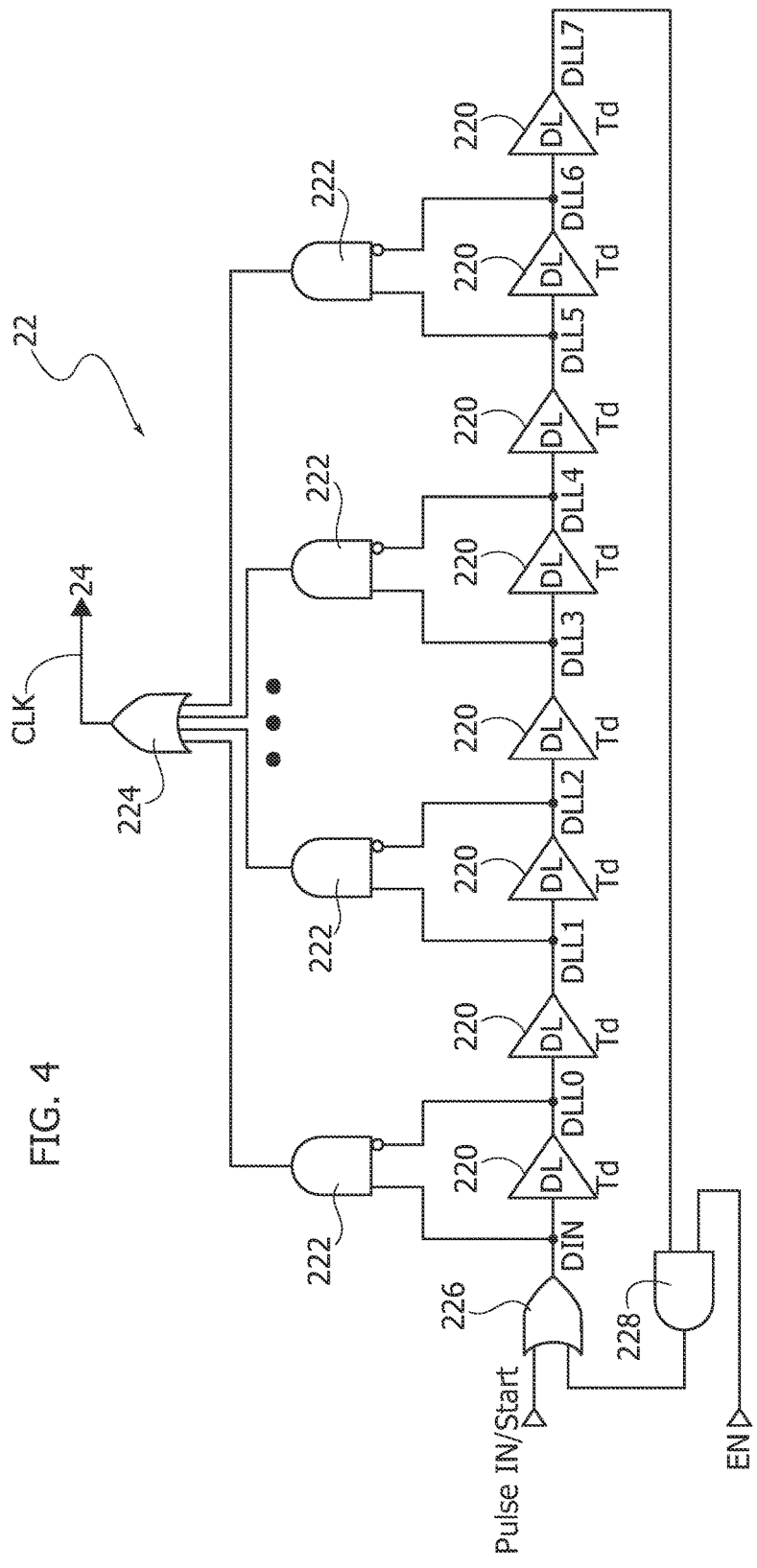
FIG. 4 is a circuit diagram of a part of a clock recovery circuit according to embodiments of the present description.

In a possible implementation illustrated in FIG. 4, the delay-locked-loop (DLL) circuit 22 can be implemented as a chain (cascade) of delay units 220 configured to apply a respective delay time Td (e.g., 16 ns to 32 ns: of course, these values are merely exemplary and non-limiting).

A combinatorial logic coupled to the delay units 220 generates a clock signal CLK having a (semi)period that is a function of the delay Td.

As illustrated, the combinatorial logic comprises AND gates 222 coupled to every other delay unit 220 starting from the first to the next-to-last delay unit 220 in the chain (cascade). Each to the AND gates 222 has a first input coupled to the input (DIN, DLL1, DLL3, DLL5, and so on) of an associated delay unit 220 and a second negated input coupled to the output (DLL0, DLL2, DLL4, DLL6, and so on) of the associated delay unit 220.

The outputs of the AND gates 222 are supplied as inputs to an OR gate 224 that produces a clock signal CLK as an output.

That is, the gates 222, 224 provide logic circuitry configured to generate the local clock signal CLK as a function of input signals applied to the delay units 220 in the chain.

As illustrated in FIG. 4, such logic circuitry thus comprises a set of AND gates 222 coupled to alternate ones of the delay units 220 in the chain, wherein each AND gate in the set has a first input coupled to the input (e.g., DIN, DLL1, DLL3, DLL5) of a respective delay unit 220 coupled thereto and a second input coupled to the (inverted) input (e.g., DLL0, DLL2, DLL4, DLL6) to the delay unit following the respective delay unit 220 in the chain.

The OR gate 224 coupled to the outputs of the AND gates thus produces the local clock signal CLK.

An OR gate 226 at the input of the DLL circuit 22 receives:
- as a first input, a Pulse IN/Start signal, and
- as a second input, the output from an AND gate 228 in turn receiving as inputs the output (here, DLL7) of the last delay unit 220 in the chain/cascade of delay units and an enable signal EN (e.g., from the rough data detector 20). As noted, while advantageous, the rough data detector 20 is not a mandatory feature. In those embodiments where the rough data detector 20 is not contemplated, other (logic) circuitry such as a simple Finite State Machine (FSM) can be provided in order to enable the loopback arrangement.

The output from the OR gate 226 at the input of the DLL circuit 22 is applied as the input DIN to the first delay unit 220 in the chain/cascade of delay units.

The Pulse IN/Start signal is a pulse signal having an "on" time Tpulse and a period between Td (the delay time of the delay units 220) and M*Td, where M is the number of delay units 22 in the chain/cascade of delay units in the DLL circuit.

That is: Tpulse<M*Td AND Tpulse>Td.

For instance, in the example illustrated, M=8 (eight).

Figure 5A:
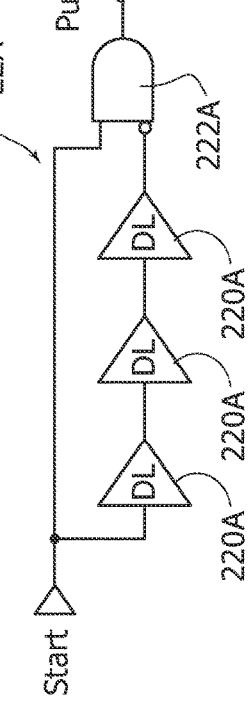
FIGS. 5A and 5B illustrate an ancillary section of the circuit of FIG. 4 and possible time behaviors of signals produced thereby.

FIG. 5A illustrate a possible circuit diagram of logic circuitry 22A that can be associated with the DLL local oscillator 22 in order to generate the signal Pulse IN/Start from a Start signal (generated in any manner known to those of skill in the art).

In the exemplary case illustrated, the Start signal is fed to a delay line comprising, e.g., three delay units 220A (each applying a delay Td).

An AND gate 222A receives:
- at a first input, the Start signal, and
- at a second input, the Start signal as delayed by the delay units 220A, after logic inversion.

Figure 5B:
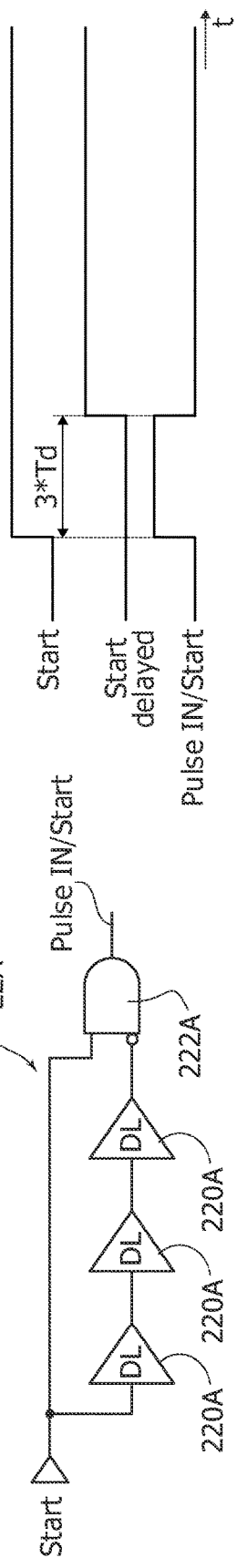

FIG. 5B comprises various time diagrams sharing a common time (abscissa) scale t that are exemplary of possible time behaviors of the following signals (from top to bottom):
- the Start signal,
- the Start signal as delayed by the delay units 220A, and
- the Pulse IN/Start signal at the output of the AND gate 222A.

As long as the enable signal EN is active, the clock pulses (signal CLK) are generated continuously with a clock period 2*Td, where Td is the delay time of the delay units 220.

Figure 6:
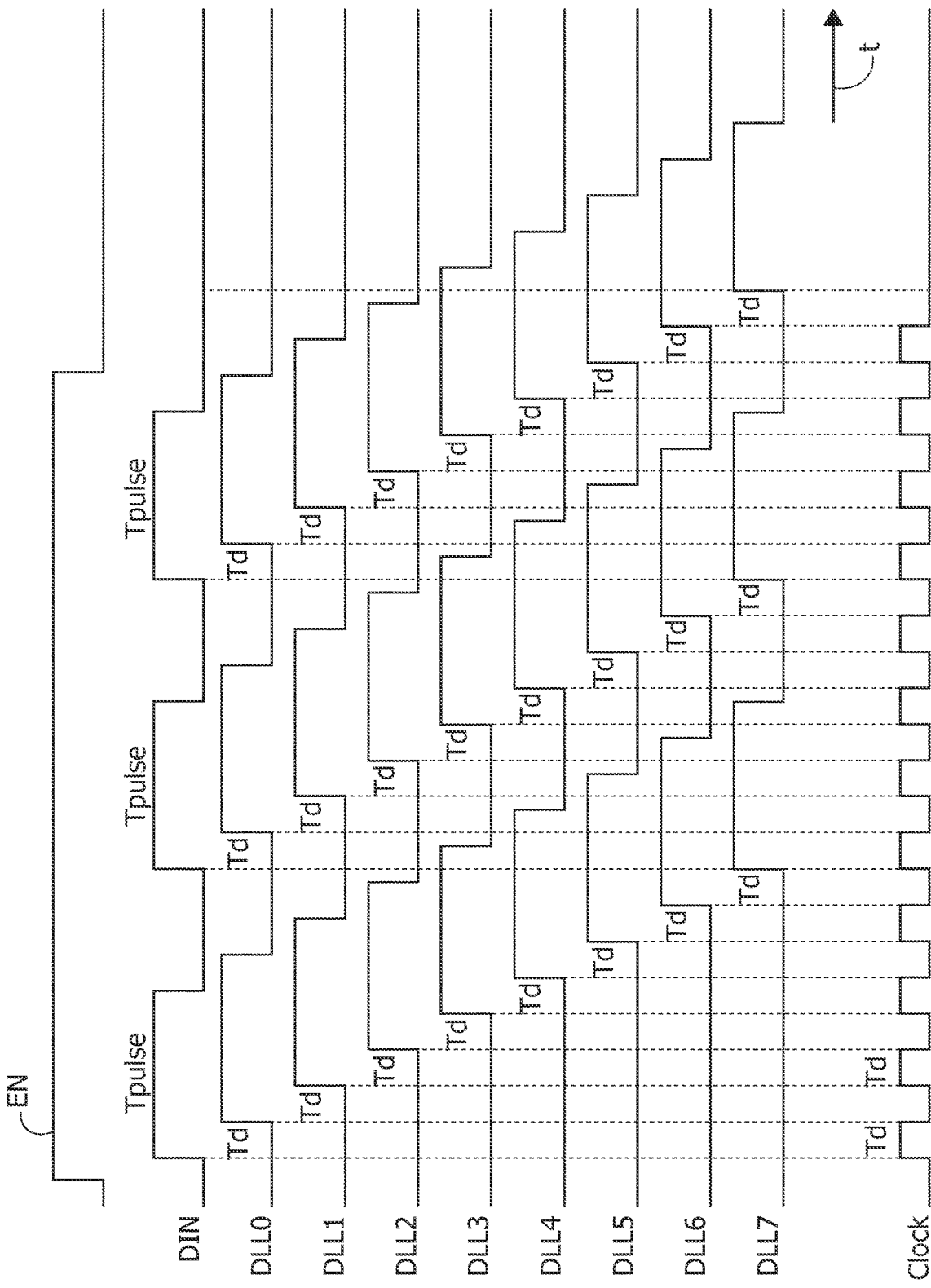
FIG. 6 comprises various diagrams exemplary of possible time behaviors of signals which may occur in a clock recovery circuit according to embodiments of the present description.

FIG. 6 comprises various time diagrams sharing a common time (abscissa) scale that are exemplary of possible time behaviors of the following signals (from top to bottom):
- the enable signal EN,
- the signals, e.g., DIN, DLL0, DLL1, . . . , DLL7 at the inputs/outputs of the delay units 220, and
- the clock signal CLK.

As noted, the delay time Td is defined as a function of the data rate of the incoming data Data_in.

For instance, the incoming data Data_in can be (over) sampled at the sampling circuit 14 with a frequency at least 16 times greater than the data rate.

In that case, the delay Td can be selected to have a maximum value Td max equal to 1/(Fdata*32), where Fdata is the input data rate (expressed in Hz) so that the maximum oversampling is 32*Fdata.

The clock divider 24 can be implemented as a simple flip-flop divider (of any known type to those of skill in the art) with the purpose of dividing the clock signal CLK in case it has a frequency higher than the maximum desired oversampling rate at, e.g., 32*Fdata.

In an arrangement as exemplified herein the phase alignment block 26 has the purpose of searching the "best" sampling edges for actuating the sampling circuit 14 in order to sample of the incoming data Data_in.

Figure 7:
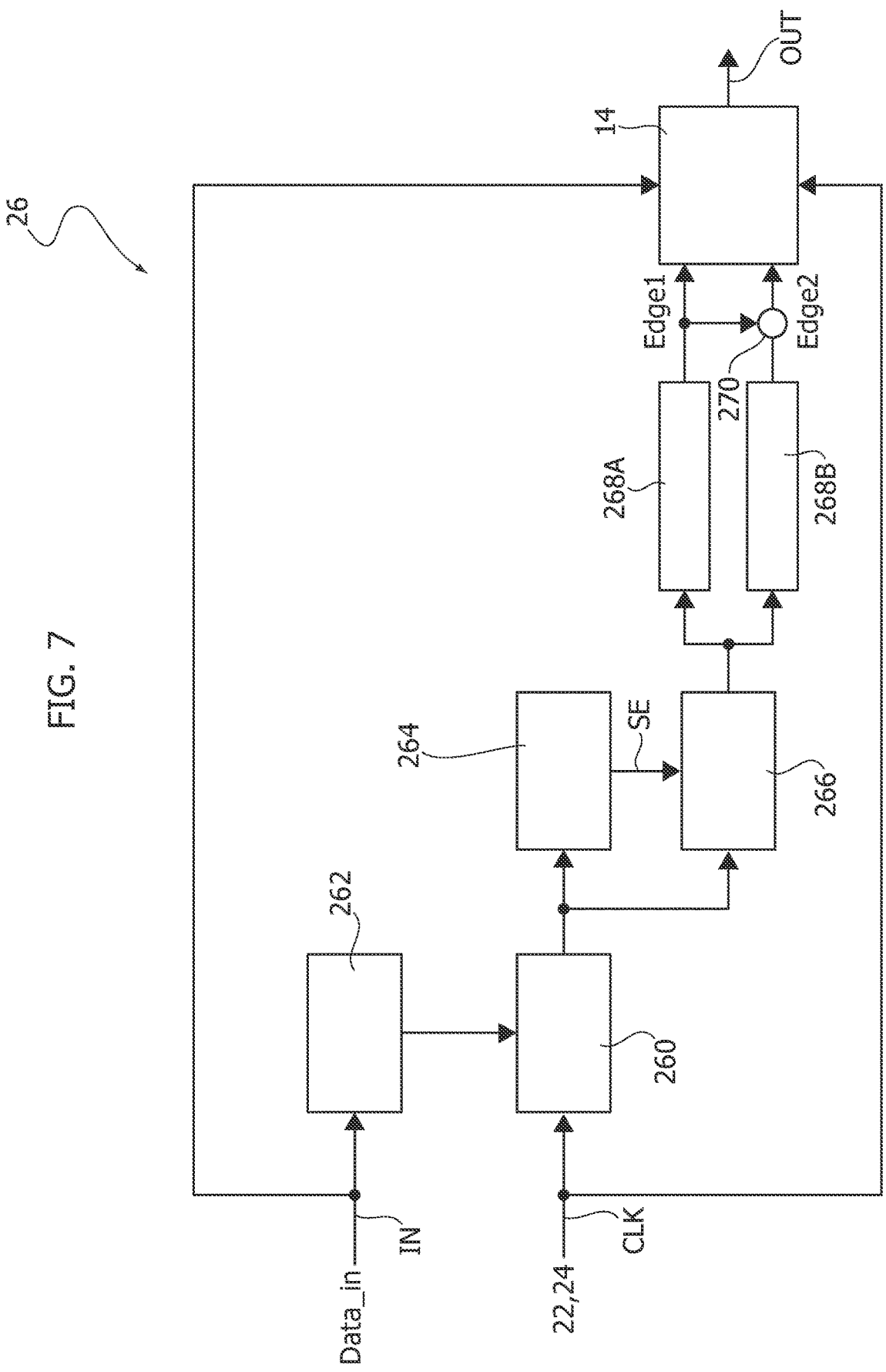
FIG. 7 is a block diagram exemplary of a possible implementation of a part of a clock recovery circuit according to embodiments of the present description.
Figure 8:
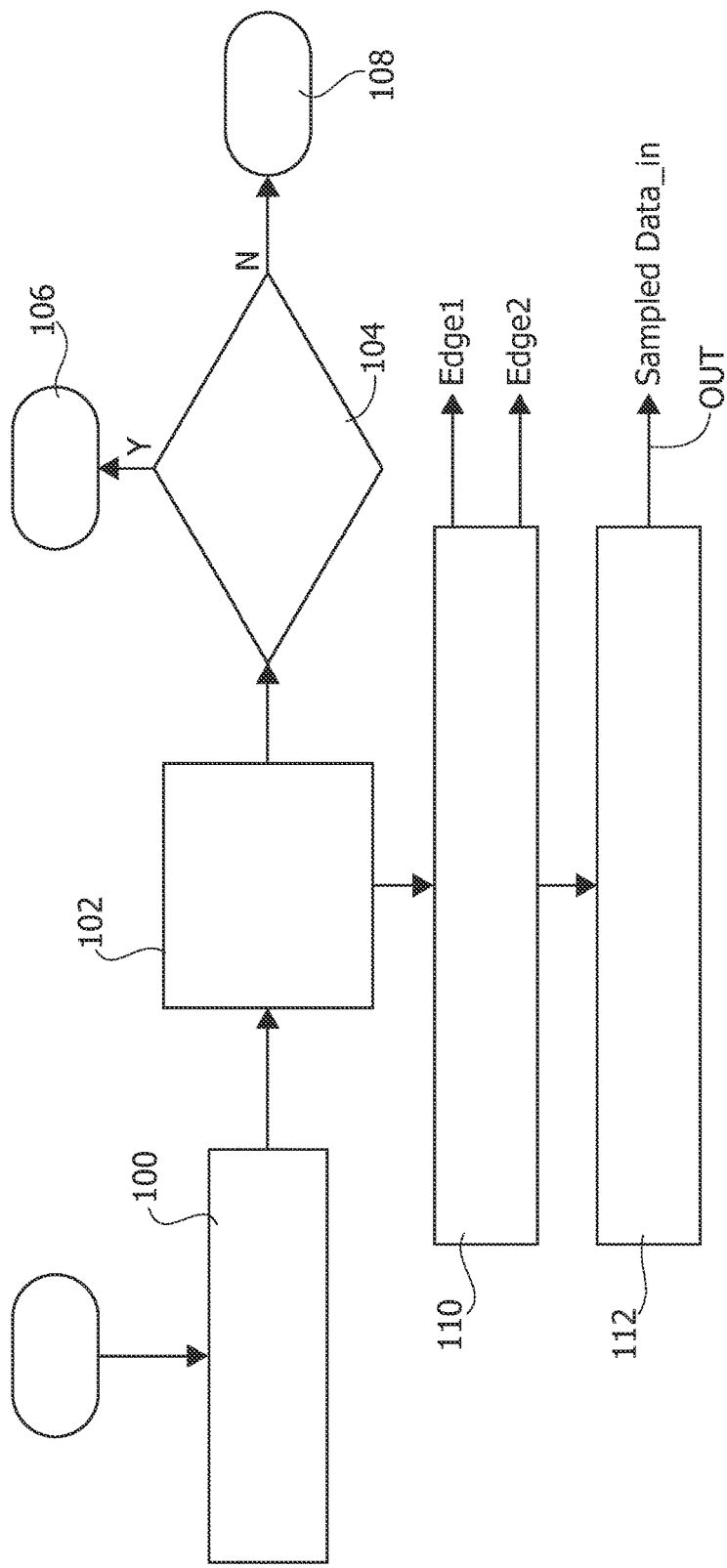
FIG. 8 is a flow chart exemplary of possible operation of the implementation of FIG. 6.

A corresponding procedure can be advantageously performed by a phase alignment block 26 as illustrated in FIG. 7 in co-operation with the sampling circuit 14; FIG. 8 reproduces a corresponding flow chart.

In the possible implementation of FIG. 7, the phase alignment block 26 comprises a counter 260 that receives the clock signal CLK (e.g., as divided in the clock divider 24) as well as the output from a (rising and falling) edge detector 262 that receives the data Data_in to be sampled.

Logic circuitry including blocks or nodes 264, 266, 268A, 268B and 270 processes the output from the counter 260 to produce a set of signals (e.g., two signals Edge 1 and Edge 2) that activate the sampling circuit 14 to sample Data_in sampled.

It is again recalled that the sampling signal SS can include a set of 1 to N components: two components, namely Edge1 and Edge2, are discussed here by way of non-limiting example for simplicity.

At every rising and falling edge of the signal Data_in, the internal counter 260 (clocked by the clock signal CLK) is sampled and then reset.

In the block 264, the sampled counter value is compared with a previous value stored in a storage block 266, and if (and only if)
- the counter value is higher than the previous one divided by two less a "delta" margin (lower bound of the update range),
AND
- the current value is lower than the previous one plus the "delta" margin (upper bound of the update range)
the value stored in the block 266 is updated with the new one in response to a sample enable signal SE.

A set of sampling edges to be supplied to the sampling circuit 14 is computed in the blocks 268A, 268B and the node 270.

For instance, in the exemplary, non-limiting case of a set consisting of two sampling edges, Edge1 and Edge2, to be supplied to the sampling circuit 14 edge computation in the blocks 268A, 268B and the node 270 can be as follows:

Edge1 is half the counter value stored in the block 266, namely the counter value stored in the block 266 divided by two (shift one bit right); and Edge2 is the sum (produced in the adder node 270) of the counter value stored in the block 266 divided by two (output of the block 268A) plus the counter value stored in the block 266, here represented as loaded in the block 268B.

As a further example, four edges, namely Edge1, Edge2, Edge3, and Edge 4, can be computed as follows:

Edge 1=one fourth (¼) the counter value, namely the counter value stored in the block 266 divided by four;

Edge 2=one fourth (¼) the counter value plus one half (½) the counter value, namely the counter value stored in the block 266 divided by two;

Edge 3=one fourth (¼) the counter value plus twice one half (½) the counter value stored in the block 266 divided by two (which is simply the counter value stored in the block 266); and Edge 4=one fourth (¼) the counter value plus three times one half (½) the counter value stored in the block 266 divided by two.

That is, in the case of N edges, where N=2^p with p=1, 2, 3, 4, ... the n-th edge (n=1, ..., N) can be computed as follows: Edge n=1/N counter+(n−1)×(1/(N/2 counter)).

Corresponding adaptations of the exemplary circuitry of FIG. 7 can be devised by those of skill in the art.

Also, it will be appreciated that selecting N as a power of two is advantageous as this facilitates computing the edges via bit shift operations.

The Data_in signal can be sampled whenever the counter 260 reaches one of the 1 to N edges computed (e.g., Edge1, Edge2): it is noted that (as exemplified in FIG. 9 below) the counter 260 may reach "further" edges such as Edge2 only in certain cases, depending on the sequence of symbols in the input signal Data_in.

The value for the "delta" margin used in updating the stored counter value can be determined (e.g., calculated or determined experimentally) taking into account process, voltage, temperature (PVT) variations in the DLL oscillator 22 and/or the type of modulation (e.g., NRZ, NRZI, FM0 or Manchester) used for transmission.

For instance, an advantageous selection of the delta margin may be about 20% of the expected data sampling rate of the input data Data_in.

The following steps/phases are represented by the blocks in the flow chart of FIG. 8, after START:

the internal counter 260 (clocked by the clock signal CLK) is sampled and then reset at every rising and falling edge of the signal Data_in (block 100);

the sampled counter value is compared with the previously stored value and if (and only if) the current counter value is higher than the previous one divided by two less a "delta" margin (lower bound of the update range), AND the current value is lower than the previous one plus the "delta" margin (upper bound of the update range) the value stored in the block 266 is updated with the new one in response to a sample enable signal SE (block 102);

a check is made as to the counter 260 can be regarded as locked to the data in signal (block 104);

the counter 260 is confirmed to be locked in response to a positive outcome ("Y") of the check in block 104 (block 106);

the procedure is aborted in response to a negative outcome ("N") of the check in block 104 (block 108);

the set of edge signals Edge1, ..., EdgeN (e.g., Edge1 and Edge2) is generated as a function of the stored counter value (block 100);

the sample circuit 14 is activated by the edge signals (e.g., Edge1 and Edge2) to produce the sampled data Sampled Data_in (block 112).

Figure 9:
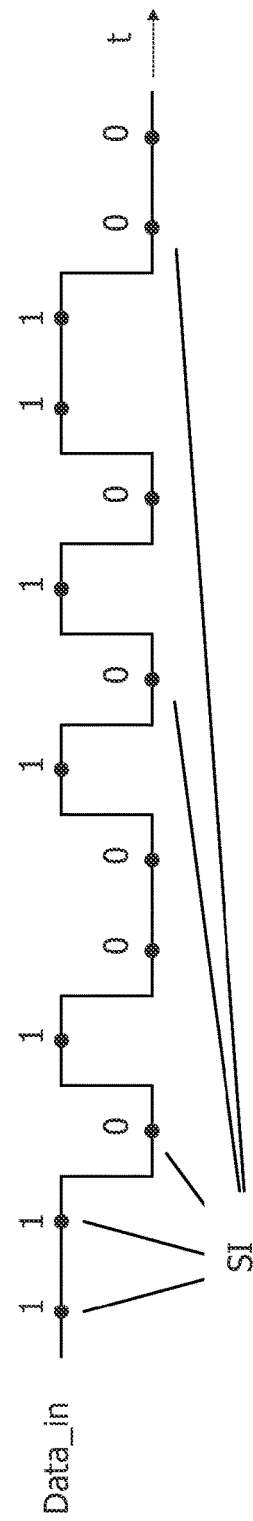
FIG. 9 is a time diagram exemplary of sampling an input signal according to embodiments of the present description.

FIG. 9 is a time diagram exemplary of sampling an input signal Data_in according to embodiments of the present description at sampling instants SI.

It is noted that selecting edges such as Edge1, ... Edge N as a function of the stored count is advantageous in so far as (in addition to being easy to compute via bit shifting) these values result in sampling instants SI that are reasonably "centered" with respect to the symbols in the input date stream Data_in both in the case of single "1" or "0" symbols and in the case of repeated symbols (e.g., "1" "1" and "0" "0").

It will be appreciated that the number N and the values for the edge signal set discussed in the foregoing by way of example are not strictly mandatory.

It is otherwise noted that in examples as discussed herein, wherein a threshold value set of up to N thresholds (N included) is produced, increasing the number N of edges Edge1, ..., EdgeN results in an improvement of the sampling result.

An arrangement as exemplified herein has a start-up transitory where the sampled values are useless and are ignored. A simple locked counter can be used to detect the end of this transitory phase.

Examples as presented herein lend themselves to being implemented in a (much) simpler way than prior art solutions.

Examples as presented herein can be implemented in fully digital form with a (very) low power consumption: for instance, clock reconstruction can be activated only if a "valid" Data_in signal is recognized and for rest of time clock reconstruction is disabled, with switching power reduced to zero.

A DLL circuit 22 as exemplified herein spares on logic, time and a precise reference clock and the associated cost with changes in Td (even 2 or 3 times) allowed for. A phase alignment feature as exemplified in FIGS. 6 and 7 can adjust the sampling edges accommodating variations in Td (and in the DLL clock CLK) due to PVT (Process, Voltage, Temperature) factors.

Without prejudice to the underlying principles, the details and the embodiments may vary, even significantly, with respect to what has been described by way of example only without departing from the scope of the embodiments.

The extent of protection is determined by the annexed claims.

What is claimed is:

1. A circuit, comprising:
an input node configured to receive a data signal having a data rate and comprising rising and falling edges;
a digital oscillator configured to produce a local clock signal with a frequency higher than the data rate, wherein the rising and falling edges in the data signal are separated by plural periods of the local clock signal;
sampling signal generator circuitry comprising a counter clocked by the local clock signal, the counter configured to have its internal count value sampled and then reset at the rising and falling edges of the data signal, and a storage block coupled to the counter to receive a sampled count value of the counter, the storage block configured to store the sampled count value of the counter, wherein the sampled count value stored in the storage block is updated in response to a current sampled count value of the counter lying in an update range between a lower bound that is a function of half a previous sampled count value previously stored in the storage block and an upper bound that is function of the previous sampled count value previously stored in the storage block, wherein the sampling signal generator circuitry is configured to produce a threshold value set as a function of an updated count value received from the storage block; and sampling circuitry configured to receive the data signal at the input node, the sampling circuitry coupled to the sampling signal generator circuitry and configured to be actuated thereby and sample the data signal at the input node and provide at an output node a sampled version of the data signal at the input node in response to the updated count value reaching any of the threshold values in the threshold value set.

2. The circuit of claim 1, wherein the lower bound is half the previous sampled count value previously stored in the storage block minus a count margin and the upper bound is the previous sampled count value previously stored in the storage block plus the count margin.

3. The circuit of claim 1, comprising a data detector coupled to the input node and configured to activate the digital oscillator, the sampling signal generator circuitry and the sampling circuitry in response to the data rate of the data signal lying in a given frequency range.

4. The circuit of claim 1, wherein the digital oscillator comprises a delay lock loop.

5. The circuit of claim 4, wherein the delay lock loop comprises:
a cascaded arrangement of N delay units in a chain each having an input-to-output delay time, Td, wherein a first delay unit in the chain is configured to receive a logic sum of an input pulse signal and an output signal from a last delay unit in the chain, the input pulse signal having an active time lying between the input-to-output delay time (Td) and N times the input-to-output delay time, N*Td; and
logic circuitry configured to generate the local clock signal as a function of input signals applied to the delay units in the chain.

6. The circuit of claim 5, wherein the logic circuitry comprises:
a set of AND gates coupled to alternate ones of the delay units in the chain, wherein each AND gate in the set of AND gates has a first input coupled to a non-inverted input of a respective delay unit coupled thereto and a second input coupled to an inverted input of a delay unit following the respective delay unit in the chain; and
an OR gate coupled to outputs of the AND gates in the set of AND gates, the OR gate producing the local clock signal.

7. The circuit of claim 5, comprising a logic gate configured to selectively gate supply of the output signal from the last delay unit in the chain towards the logic sum received by the first delay unit in the chain.

8. The circuit of claim 1, wherein the digital oscillator has coupled therewith a clock divider configured to divide the frequency of the local clock signal, wherein the counter is clocked by the local clock signal frequency-divided at the clock divider.

9. The circuit of claim 1, wherein the sampling signal generator circuitry is configured to produce the threshold value set of up to N thresholds, wherein an n-th threshold in the threshold value set is computed as:

$$1/N \text{ counter} + (n-1) \times (1/(N/2 \text{ counter})),$$

wherein n=1, . . . , N and counter is the updated count value received from the storage block.

10. The circuit of claim 9, wherein N is a power of two.

11. A receiver, comprising:
a circuit comprising:
an input node configured to receive a data signal having a data rate and comprising rising and falling edges;
a digital oscillator configured to produce a local clock signal with a frequency higher than the data rate, wherein the rising and falling edges in the data signal are separated by plural periods of the local clock signal;
sampling signal generator circuitry comprising a counter clocked by the local clock signal, the counter configured to have its internal count value sampled and then reset at the rising and falling edges of the data signal, and a storage block coupled to the counter to receive a sampled count value of the counter, the storage block configured to store the sampled count value of the counter, wherein the sampled count value stored in the storage block is updated in response to a current sampled count value of the counter lying in an update range between a lower bound that is a function of half a previous sampled count value previously stored in the storage block and an upper bound that is function of the previous sampled count value previously stored in the storage block, wherein the sampling signal generator circuitry is configured to produce a threshold value set as a function of an updated count value received from the storage block; and
sampling circuitry configured to receive the data signal at the input node, the sampling circuitry coupled to the sampling signal generator circuitry and configured to be actuated thereby and sample the data signal at the input node and provide at an output node a sampled version of the data signal at the input node in response to the updated count value of the counter reaching any of the threshold values in the threshold value set; and
a user device coupled to the output node, and configured to receive from the output node the sampled version of the data signal.

12. A method, comprising:
receiving, at an input node, a data signal having a data rate and comprising rising and falling edges;
producing a local clock signal with a frequency higher than the data rate, the rising and falling edges in the data signal being separated by plural periods of the local clock signal;
producing, by a counter, an internal count value clocked by the local clock signal, the internal count value sampled and then reset at the rising and falling edges of the data signal, and storing a sampled count value in a storage block, the sampled count value being updated in response to a current sampled count value lying in an update range between a lower bound that is a function of half a previous sampled count value previously stored and an upper bound that is function of the previous sampled count value previously stored;
producing a threshold value set as a function of an updated count value; and sampling the data signal at the input node and providing at an output node a sampled version of the data signal at the input node in response to the updated count value reaching any of the threshold values in the threshold value set.

13. The method of claim 12, wherein the lower bound is half the previous sampled count value previously stored minus a count margin and the upper bound is the previous sampled count value previously stored plus the count margin.

14. The method of claim 12, further comprising producing the threshold value set of up to N thresholds, and computing an n-th threshold in the threshold value set as:

$$1/N \text{ counter} + (n-1) \times (1/(N/2 \text{ counter})),$$

wherein n=1, ..., N and counter is the updated count value received from the storage block.

15. The method of claim 14, wherein N is a power of two.

16. The method of claim 12, further comprising, before the producing the local clock signal, detecting the data rate of the data signal being within a given frequency range.

17. The method of claim 12, wherein the producing the local clock signal being performed by a digital oscillator comprising a delay lock loop having logic circuitry and a cascaded arrangement of N delay units in a chain each having an input-to-output delay time (Td), and the method further comprising:

receiving, by a first delay unit in the chain, a logic sum of an input pulse signal and an output signal from a last delay unit in the chain, the input pulse signal having an active time lying between the input-to-output delay time (Td) and N times the input-to-output delay time, N*Td; and generating, by the logic circuitry, the local clock signal as a function of input signals applied to the delay units in the chain.

18. The method of claim 17, wherein the logic circuitry comprises a set of AND gates coupled to alternate ones of the delay units in the chain, and an OR gate coupled to outputs of the AND gates in the set of AND gates, and the method further comprises producing, by the OR gate, the local clock signal.

19. The method of claim 17, further comprising selectively gating, by a logic gate, supply of the output signal from the last delay unit in the chain towards the logic sum received by the first delay unit in the chain.

20. The method of claim 17, wherein the digital oscillator has coupled therewith a clock divider, and the method further comprises:
dividing, by the clock divider, the frequency of the local clock signal; and
clocking the counter by the local clock signal frequency-divided at the clock divider.

* * * * *